Aug. 10, 1965 G. ABRAHAM 3,200,266

MULTISTABLE CIRCUIT EMPLOYING PLURALITY OF PARALLEL-CONNECTED SEMICONDUCTOR DEVICES EACH HAVING MORE THAN ONE PN JUNCTION

Filed March 22, 1963 2 Sheets-Sheet 1

INVENTOR.
GEORGE ABRAHAM
BY Glenn S. Dvorak Agent
Richard C. Reed
ATTORNEY

Aug. 10, 1965 G. ABRAHAM 3,200,266

MULTISTABLE CIRCUIT EMPLOYING PLURALITY OF PARALLEL-CONNECTED SEMICONDUCTOR DEVICES EACH HAVING MORE THAN ONE PN JUNCTION

Filed March 22, 1963 2 Sheets-Sheet 2

INVENTOR.
GEORGE ABRAHAM

BY Glenn S. Orovitz Agent
Richard C. Reed

ATTORNEY 3,200,266

MULTISTABLE CIRCUIT EMPLOYING PLURALITY OF PARALLEL-CONNECTED SEMICONDUCTOR DEVICES EACH HAVING MORE THAN ONE PN JUNCTION

George Abraham, 3107 Westover Drive SE., Washington, D.C.

Filed Mar. 22, 1963, Ser. No. 267,372
7 Claims. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

This is a continuation-in-part of application Serial No. 86,262, filed January 31, 1961.

The present invention relates in general to electrical signal translating circuits and in particular to multistate or multistable circuits.

Multistable circuits are used as fundamental elements in many electronic devices. By way of example, electronic counters, a plurality of multistable circuits, connected in tandem, may be used when it is desired to count pulses occurring either at regular intervals or at random. At present, counters of this variety employing conventional bistable circuits have a number of disadvantages. For example, to obtain only two stable states, conventional circuits usually require a complicated arrangement using two transistors, or two electron tubes. Thus, when several bistable circuits are utilized in a single counter, the physical size and weight of the counter is appreciable. If electron tubes are used, the power consumption is high, and a large portion of the power supplied to the counter, because of low efficiency, is dissipated as heat.

In other applications for patent, such as my application, Serial No. 629,762, filed December 20, 1956, now U.S. Patent No. 2,939,965, which issued June 7, 1960, I have disclosed notable advancements of the art whereby a composite voltage-current characteristic with a plurality of negative resistance regions could be obtained. These advancements involved electrical connection of separate elements in a series arrangement. In copending application, Serial No. 82,262, filed January 31, 1961, I have disclosed notable advancements of the art whereby such a composite voltage-current characteristic with a plurality of negative resistance regions can be obtained using voltage-controlled negative resistance devices in a more compact circuitry. The above-mentioned copending application is adapted for switching over a wide range of voltage. The need for a more compact circuitry adapted for switching in a multistable manner over a wide range of current, likewise, will be appreciated.

In accordance with the foregoing, it is an object of the present invention to provide a compact multistable circuit having more than two stable states.

Another object of the present invention is to provide a multistable circuit employing a minimum number of circuit elements and requiring a negligible amount of power.

Another object of the present invention is to provide an electrical circuit having a current-controlled negative resistance characteristic with a plurality of stable states.

It is still another object of this invention to provide a multistable electrical circuit of the current-controlled negative resistance variety which may be triggered from one stable state to another utilizing a single load line and/or can be made to oscillate at multiple frequencies.

It is a further object of this invention to provide a multistable circuit of the current-controlled negative resistance variety which permits fabrication on a single slab of semiconductor substrate.

Other objects and many of the attendant advantages of this invention will be readily apparent as the same becomes better understood with reference to the following detailed description when considered in connection with the accompanying drawings wherein:

FIG. 1 discloses a typical embodiment of the present invention.

Figures 1, 2, 6, 7, 8:
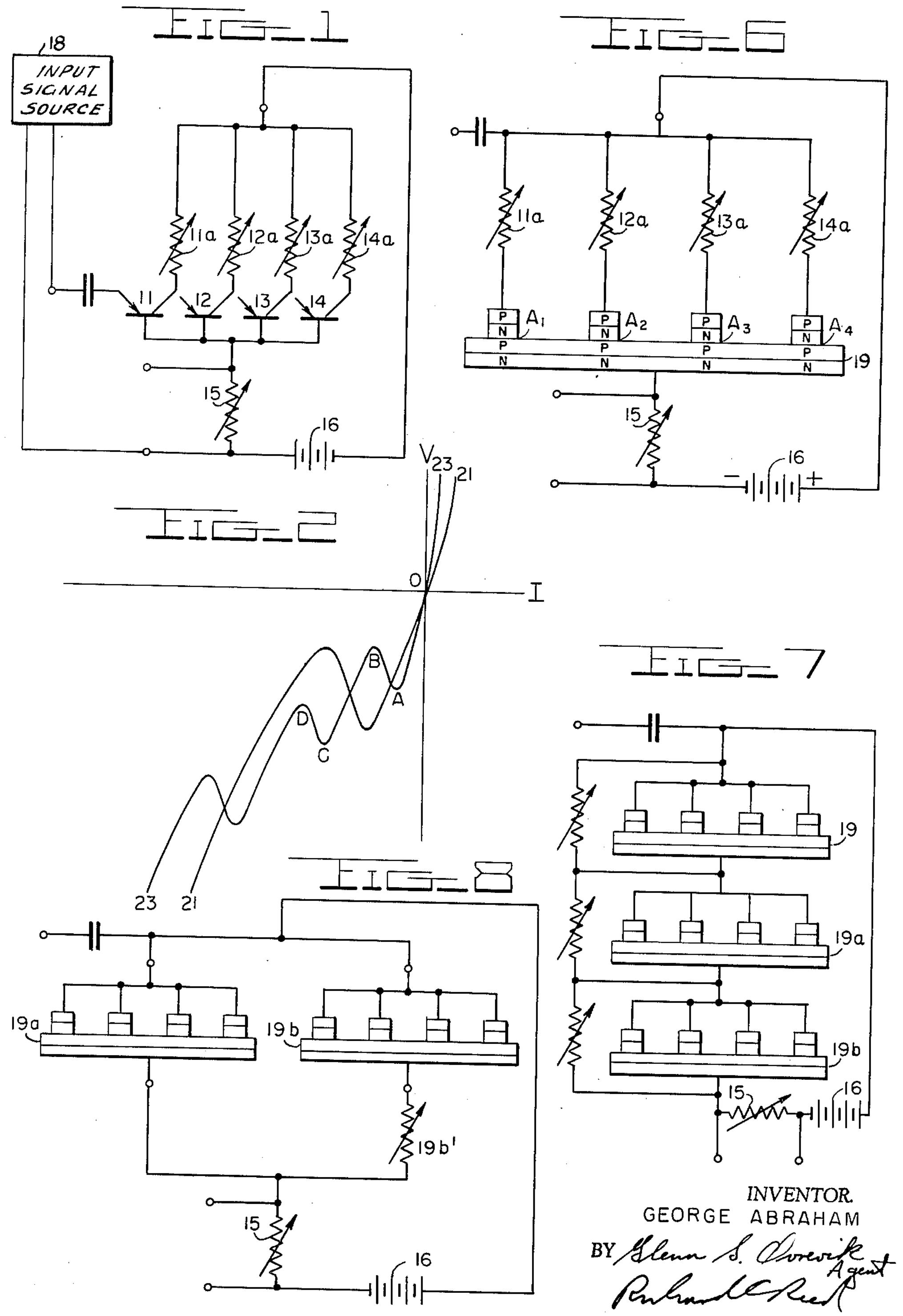
FIG. 2 represents a composite negative resistance curve of the circuit shown in FIG. 1.

FIG. 6 discloses an other typical embodiment of this invention on a single substrate.

Figure 5:
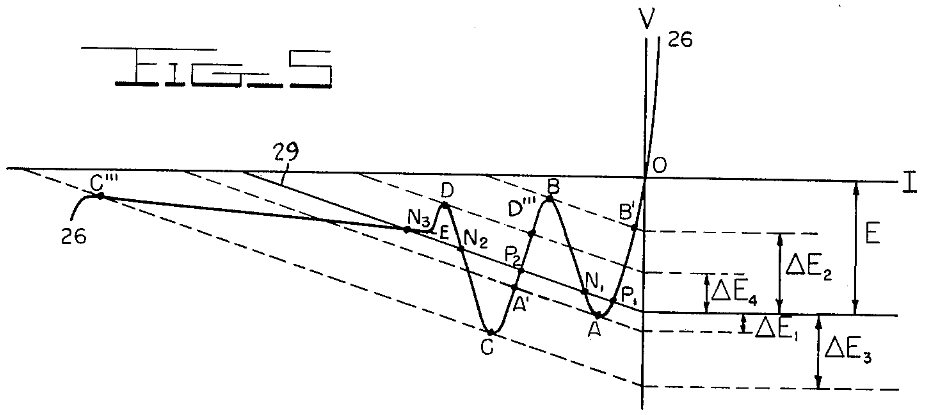

FIG. 7 also discloses another typical embodiment of this invention with serially-connected composite devices of the variety shown in FIG. 5.

FIG. 8 discloses still another typical embodiment of this invention with parallel connection of composite devices of the variety shown in FIG. 6.

In accordance with the present invention, a useful multistable circuit is provided wherein a plurality of devices each capable of exhibiting an open-circuit stable type of negative resistance characteristic are connected in parallel across an output circuit to form a composite characteristic with alternate negative resistance regions separated by regions of positive resistance over selected voltage increments and means are provided for increasing or decreasing the negative resistance or active region of each device. The multistable circuit thus obtained may be triggered to a desired stable region several ways, i.e., by varying the relative amplitude, phase, or width of pulses applied to a selected element of the variable impedance devices, or by varying the impedance load on the variable impedance devices, etc. For example, triggering from a first stable region to a second stable region may be accomplished by applying a pulse of proper amplitude, polarity, width, and shape, for a given load line to a desired element of a selected variable impedance device and a pulse of reverse polarity which may be similar in other respects will trigger the multistable circuit from the second to the first region.

Referring to FIG. 1 a typical embodiment of the device of this invention is shown comprising a plurality of variable impedance devices 11, 12, 13, and 14, connected in series with variable resistances 11A, 12A, 13A, and 14A respectively, and in shunt with one another across variable impedance 15 and battery 16 in series connection. As shown in this figure, the battery 16 reverse biases each of the variable impedance devices. The output of the multistable circuit may be taken across variable impedance 15, as indicated. A source of input signals 18 is connected to a selected element of variable impedance device 11. It is, of course, understood that the source of input signals could be connected with proper polarity to another element of variable impedance device 11 or to any desired element of variable impedance devices 12, 13, or 14.

The variable impedance devices 11, 12, 13, and 14 may be any semiconductor devices capable of exhibiting an open-circuit stable negative resistance characteristic. For example, thyratrons or NPN type transistors may be utilized.

The variable resistances 11A, 12A, 13A, and 14A are provided to insure that the effective parallel impedances of devices 11, 12, 13, and 14 and their serially connected variable resistances, respectively, 11A, 12A, 13A, and 14A, are different. It will be appreciated, of course, that where the junction impedances of the devices 11, 12, 13 and 14 are designed to be appropriately different, the variable resistances 11A, 12A, 13A, and 14A are not essential to the invention and may be eliminated from the circuitry. As a practical matter, it has been found advisable to incorporate these variable resistances to permit control of the impedance ratio of these devices.

Likewise, it will be appreciated that the variable resistances 11A, 12A, 13A, 14A may be employed in parallel with each of the individually operative devices for the same impedance compensation purpose, if desired, provided, of course, unidirectional means are incorporated with each device to avoid interaction between devices.

Referring now to FIG. 2, it has been found that the characteristic curve for an assembly of open-circuit stable devices in parallel is dependent upon the resistive impedance relation between devices. In the rare circumstance where the devices are identical in resistive impedance, the characteristic curve takes the form of a large N as shown at 21 due to the fact that all devices react simultaneously. Normally the resistance portion of the device impedance, which is the principal portion at low frequencies, differs in each device to a slight extent in the case of devices of a similar variety selected at random. This slight difference in resistive impedance will provide a composite characteristic curve of the type shown at 23 due to the successive reaction of each device. It will be noted that in the composite characteristic curve 23 the negative resistance regions, A–B and C–D, do not overlap. That is, the difference in resistance impedance is inappropriate to effect a significant overlap such that portions of at least two of the negative resistance regions overlap within a selected voltage range.

Figure 3:
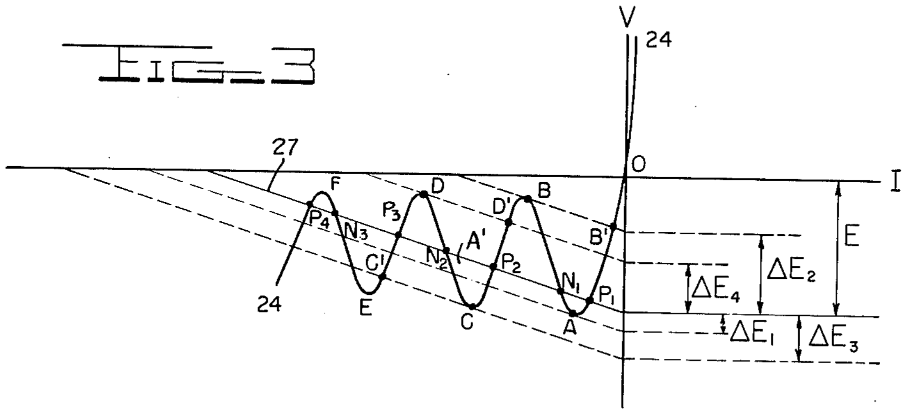
FIGS. 3–5 represent single load lines drawn on composite negative resistance curves of the variable impedance devices in the circuit shown in FIG. 1.
Figure 4:
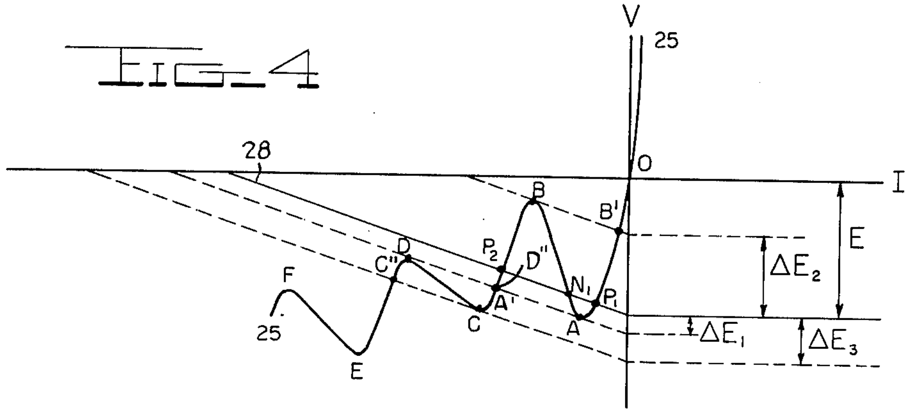

The curve 23 in FIG. 2, the curve 24 in FIG. 3, the curve 25 in FIG. 4 and the curve 26 in FIG. 5 each depict a composite voltage-current curve having a characteristic which is generally termed in the art as an N type, current-controlled, "current-stable" or open-circuit stable negative resistance characteristic. For purposes of the present disclosure the term "open-circuit stable" is employed to define this type of negative resistance characteristic.

Referring to FIG. 3, a composite open-circuit stable voltage current characteristic curve is shown which is similar to curve 23 in FIG. 2 but differs in the relative position of the several portions thereof with respect to one another. In particular, the negative resistance regions A–B, C–D, and E–F overlap at a selected voltage level. It has been found that by control of the relative internal impedances of the several devices 11, 12, 13, and 14 by various techniques to be described hereinafter, the position of the portions of the composite voltage current characteristic curve representative of the respective devices 11, 12, 13, and 14 may be shifted such that negative resistance and positive resistance regions of each portion can be located so as to fall within similar voltage ranges of the other portions of the composite characteristic and therefore may be intersected by a common positive resistance load.

It will be appreciated that in the present state of the art, a determination of the precise internal impedance of each of the devices 11, 12, 13, and 14 prior to the assembly thereof would be costly and perhaps impractical on a mass production basis. However, appropriate values of internal impedance may be obtained by a variety of less costly standard laboratory techniques such as oscilloscope comparison of various devices under identical excitation conditions before the parallel assembly thereof or possible substitution of various devices in the parallel connection of FIG. 1 to obtain the proper combination which affords a characteristic curve of the type shown in FIGS. 3, 4, and 5.

As a practical expedient, external means may be provided to control the effective internal impedances of the devices 11, 12, 13, and 14. For example, resistive elements such as depicted in FIG. 1 (11A, 12A, 13A, and 14A) may be employed in series with each of the avalanche transistors 11, 12, 13, and 14. Otherwise, individual voltage sources, not shown, may be applied across the devices 11, 12, 13, and 14 and varied independently to alter the relative impedance thereof. For example, individual variable voltage sources may be connected across the emitter base of avalanche transistors, to vary the breakdown voltages and correspondingly relative internal impedance (collector-base) of the avalanche transistors 11, 12, 13, and 14.

FIG. 6 depicts another embodiment of the invention comparable in many respects to the embodiment of FIG. 1, wherein the variable impedance devices 11, 12, 13, and 14 are associated on a common 2 layer junction structure of semiconducting material indicated at 19, in a single complex variable impedance device. In this embodiment devices of the four layer variety are shown wherein additional PN junction semiconductor regions are added epitaxially or by other methods to the initial PN junction slice, as indicated at $A_1$, $A_2$, $A_3$ and $A_4$, to form a multiple junction structure, as indicated. It will be appreciated, of course, that other semiconductor structures, for example, PNP junction structures, may be alloyed to an N type slice, if desired, to produce a plurality of 4 layer devices of comparable nature. It will be appreciated that with a uniform semiconducting material, as the structure 19, and with identical manufacturing techniques and conditions, the alloyed junctions may be substantially identical. As pointed out previously, it is essential to the operation of this invention that the relative impedances of the devices of 11, 12, 13, and 14 be different. Therefore, in the instance when the devices are substantially identical some means for altering the impedance of the parallel branches such that they will differ is essential to this embodiment. In FIG. 6, the series resistances **11*a*, 12*a*, 13*a*, and 14*a* serve this function. It will be appreciated, of course, that these series resistances need not be variable, as shown, and that fixed resistances may be substituted if desired. In FIG. 6, as in the embodiment of FIG. 1, variable load impedance 15 and D.C. source 16 are connected across the parallel connection of variable impedance devices and the output is taken across the load impedance 15. With the D.C. source 16** polarity as shown, each device would constitute two forward biased junctions separated by a reverse biased junction.

FIG. 7 depicts still another embodiment of the invention employing a plurality of complex 4 layer variable impedance devices on respective substrate structures, indicated at 19, 19A, and 19B, electrically connected in series with the load impedance 15 and D.C. source 16 connected thereacross. It will be appreciated that this embodiment affords a number of advantages over the embodiments of FIGS. 1 and 6. For example, the embodiment of FIG. 7 provides a voltage distribution which is useful in applications where the voltage across one variable impedance device would exceed breakdown voltage rating of the device. In addition, the embodiment is useful where physical limitations restrict the number of contacts per substrate structure.

FIG. 8 also depicts an embodiment of the invention employing a plurality of complex variable impedance devices of the variety shown in FIGS. 6 and 7. In this embodiment respective substrate structures indicated at 19A and 19B are shown in parallel connection with the load impedance 15 and D.C. source 16 connected thereacross. In this embodiment the branches of the above-mentioned parallel connection differ in overall impedance, that is, the substrate structure indicated at 19B is connected in series with a variable impedance 19B' whereby each of the two complex variable impedance devices is established at a different level. It will be appreciated that in a selective application the series impedance 19B' need not be variable and that this series impedance is only necessary to this embodiment where the devices embodying substrate structures 19A and 19B have substantially identical characteristics.

Furthermore, it will be noted that in the embodiments of FIGS. 7 and 8 the impedances **11*a*, 12*a*, 13*a*, and 14*a*** of FIG. 6 are not incorporated with each complex variable impedance device. The essential difference between each complex variable impedance device is accomplished in the embodiments of FIGS. 7 and 8 by grading the semiconductor material of at least one layer of the multiple layer substrate structure. In this arrangement, the breakdown points on the characteristic curve are "built in" to sum asymmetrically. Using this technique the variable resistors of FIGS. 1 and 6 can be omitted given properly designed asymmetrical characteristics.

It will be seen that the means for varying the internal impedance of the devices 11, 12, 13, and 14 is not critical to the invention and that a variety of different means may be employed for this purpose depending on the mode of operation desired.

It will be noted that a single load line is drawn on each of the composite voltage-current characteristic curves 24, 25, and 26 of a multistable circuit shown in FIGS. 3, 4, and 5, respectively. Assuming other impedances in the circuit are negligible, it will be noted that each of the load lines 27, 28 and 29 in FIGS. 3, 4, and 5, respectively, is shown intersecting the composite voltage-current characteristic curves 24, 25, and 26 at several points, in regions where the slope of the curve is negative as well as where the slope of the curve is positive. The points of intersection in the positive slope region represent stable points of operation for the multistable circuit, $P_1$, $P_2$, $P_3$, etc. On the other hand, the points of intersection in the negative resistance region $N_1$, $N_2$, etc. (FIGS. 3 and 4), do not represent points of operation for values of load resistance greater than that of the negative resistance. As will be discussed hereinafter in connection with FIG. 5, the point of intersection in the negative resistance region $N_3$ may be point of operation for values of load resistance less than the negative resistance.

In FIG. 3, the curve 24 is so adjusted relative to the load line to permit bistable, tristable, etc., operation, depending upon the number of negative resistance regions available, between selected current levels, dependent upon the value and polarity of the input pulse signal applied to the circuit via the variable impedance device 11 by the source of input signals 18 in the embodiment of FIG. 1. For purposes of this disclosure, the "value" of the input pulse signal is to be considered as a function of pulse magnitude and pulse width and the input signal is to be considered as the effective voltage applied across the series combination, rather than the actual voltage applied to the emitter by source 18.

Considering bistable operation of the device of this invention, under the conditions of characteristics curve 24, a normal bias voltage E maintains the device in a stable condition, for example, in its first stable region O–A, at point $P_1$. Thereafter, an input pulse from input source 18 of $\Delta E_1$ value and negative polarity with respect to bias voltage E will move the circuit to switching condition point A whereupon switching to the next stable region B–C, to point A', will suddenly occur.

After this pulse is applied the device will remain in the second stable region B–C, at point $P_2$, (a) until an input pulse of value $\Delta E_2$ and of positive polarity is applied which will move the circuit to switching condition at point B whereupon switching to the first stable region O–A, to point B' will suddenly occur, or (b) until an input pulse of value $\Delta E_3$ and of negative polarity is applied which will move the circuit to switching condition at point C whereupon switching to the third stable region D–E, to point C', will suddenly occur. Again the bias voltage E will maintain the circuit in its stable state at point $P_1$ of the region O–A, or at point $P_3$ of the region D–E until another input pulse of selected value and polarity is applied.

In FIG. 4 the curve 25 is so adjusted relative to the load line 28 to permit bistable operation in the first and second stable regions and to permit monostable operation in another region dependent upon the value and polarity of the voltage pulse applied to the circuit via the variable impedance device 11 by the source of input signal 18 in the embodiment of FIG. 1.

Bistable operation in the first and second stable regions of characteristic curve 25 is identical with that just described in connection with characteristic curve 24. Since the load line 28 does not intersect either the second negative resistance region or the third stable region, a different type of operation generally termed monostable occurs in the second and third stable regions B–C and D–E, respectively. Thus when the device is being maintained in its second stable region B–C, at point $P_2$, by reason of the normal bias voltage E, and an input signal of value $\Delta E_3$ of negative polarity is applied to the circuit, the device is moved to switching condition at point C whereupon switching to the third stable region D–E, to point C'', will suddenly occur. As long as the input signal remains the device will stay in the third stable region at point C'', but as soon as the input signal is removed, the device moves to switching condition at point D whereupon switching to the second stable region B–C, to point D'' (coincident with point A' for simplicity in drawing) will suddenly occur. Again the voltage E will return and maintain the device in its second stable region B–C, at point $P_2$, until another input pulse signal of selected value and polarity is applied to the circuit.

In FIG. 5, the curve 26 is so adjusted relative to the load line 29 to permit bistable operation in the first and second stable regions and to permit astable operation in another region.

Again, the bistable operation in the first and second stable regions of characteristic curve 26 is identical with that described for characteristic curve 24. In this instance the load line 29 intersects the second negative resistance region at $N_2$, does not intersect the third stable region D–E and intersects the third negative resistance region at $N_3$. Thus when the device is being maintained in its second stable region B–C, at point $P_2$, by reason of the normal bias voltage E, and an input pulse of value $\Delta E_3$ and negative polarity is applied to the circuit, the device is moved to switching condition at point C whereupon switching to the third negative resistance region, to point C''', will suddenly occur. At point C''', assuming sufficient reactance in the circuit, oscillation begins. As long as the input signal remains, oscillation continues at point C''' and when the input signal is removed the normal bias voltage controls and oscillation continues at point $N_3$. Thereafter an input pulse from input source 18 of value $\Delta E_4$ will move the circuit into the stable region D–E and into switching condition at point D whereupon switching to the next stable region B–C, to point D''', will suddenly occur. Again the voltage E will maintain the circuit in stable region B–C, at point $P_2$, until another input pulse of selected value and polarity is applied.

While bistable operation involving switching between adjacent stable regions has been described in connection with FIGS. 3, 4, and 5, it will be appreciated that switching between other stable regions may be obtained, employing comparable circuitry, by the application of input pulse signals of greater value. In such instance, of course, a correspondingly greater output signal may be obtained.

For example, in FIG. 3, switching may be accomplished from point $P_1$ of the first stable region to point $P_3$ of the third stable region by the application of a pulse of negative polarity having a value $\Delta E_3$ and returned to point $P_1$ of the first stable region, if desired, by the application of a pulse of positive polarity having a value $\Delta E_2$. It will be appreciated that the pulse values listed above are the minimum values required for the switching actions and that value of the pulse is not critical so long as it attains the required minimum and does not go above the minimum requirement for the next adjacent stable region.

It will be seen that by proper orientation of the characteristic curve relative to the load line, the input voltage $\Delta E_1$ and $\Delta E_2$, for example, may be of equal value such that a switching action for bistable operation may be obtained by a reversal of the polarity of the input signal. Likewise, by proper orientation, the negative input voltage $\Delta E_1$, $\Delta E_3$, etc., for example, may be in any selected relation such as $\Delta E_3 - n\Delta E_1$ or $\Delta E_3 = \Delta E_1 + nk$ where $n$ is an integer and $k$ is a constant voltage.

The device of this invention has been tested and operated successfully and has provided a quadristable and higher radix counter. This has been accomplished with a single layer substrate of extrinsically doped germanium and silicon.

Furthermore, the device of this invention may be triggered from one state to another by means other than the input pulse variation discussed above. For example, the device of this invention may be triggered by varying the slope of the load line. Basically, any means for increasing or decreasing the energy level of the system, electrical, optical, thermal or otherwise, may be employed to trigger the device of this invention.

Moreover, it will be appreciated that this invention is not restricted to multilayer semiconductor devices of the Binistor, Stabistor, silicon-controlled rectifier variety as shown in several embodiments. Basically, any solid state thyratron, including those having a substrate of a non-semiconductor material such as glass, indeed, any thyratron capable of exhibiting a negative resistance characteristic of the type described herein may be utilized. In addition, it is understood that the device of this invention may incorporate any means of the composite current-controlled negative resistance variety irrespective of the means employed for development of this characteristic, if any. By this invention, a new multistable circuit has been provided wherein its multistable operation may be triggered from a first selected stable region to a second selected stable region by the application of a first input signal and from a second stable region to a third stable region by the application of a second input signal, ad infinitum. With an appropriate input pulse, triggering from any state to any other state of the composite characteristic is feasible. Thus the device will produce an output representative of the input signal applied and may be employed as a pulse counter or staircase generator. In addition to its multistable operation, the device may be adapted for monostable or astable operation or combinations thereof in conjunction therewith, if desired. As a result, a vastly more useful computer type operation may be obtained with a minimum number of circuit components.

It should be understood, of course, that the foregoing disclosure relates to only preferred embodiments of the present invention and that it is intended to cover all changes and modifications of the example of the invention herein chosen for the purposes of disclosure, which do not constitute departures from the spirit and scope of the invention.

What is claimed is:

1. A multistable semiconductor circuit, comprising:

a plurality of semiconductor devices each having more than one PN junction;

conductive means connecting each of said semiconductor devices in parallel with each other, each semiconductor device in combination with said conductive means forming a branch of the parallel connection;

output load means;

bias means coupling said output load means to the parallel connected plurality of semiconductor devices to form a current conductive loop with each of said semiconductor devices;

said bias means reverse biasing at least one of said PN junctions in each semiconductor device so that each device is caused to generate an open-circuit stable negative resistance characteristic;

each of the branches in said parallel connection of semiconductor devices having a different resistive impedance, the resistive impedances of the branches being in such relation that a composite voltage-current characteristic is formed by the open-circuit stable negative resistance characteristics generated by each of said semiconductor devices.

2. A multistable semiconductor circuit as recited in claim 1, wherein said conductive means includes a plurality of variable resistors each of which is connected in series with a respective one of said semiconductor devices.

3. A multistable semiconductor circuit as recited in claim 1, wherein each of said semiconductor devices in parallel connection are on a common substrate.

4. A multistable semiconductor circuit as recited in claim 3, wherein said common substrate is a semiconductor and forms a PN junction with each of said semiconductor devices.

5. A multistable semiconductor circuit as recited in claim 4, wherein said common substrate is graded such that each of said semiconductor devices has a different resistive impedance.

6. A multistable semiconductor circuit as recited in claim 1, wherein at least two pluralities of said semiconductor devices in parallel connection are included, said pluralities of devices being connected in series with each other and with said load means and bias means, and variable impedance means coupled across each of said pluralities to regulate the current therethrough, thereby forming a single composite negative resistance characteristic for said multistable circuit.

7. A multistable semiconductor circuit as recited in claim 1, wherein at least two pluralities of said semiconductor devices in parallel connection are included, and variable impedance means coupling said pluralities of devices in parallel with each other;

said impedance means regulating the level of operation of each plurality of devices, thereby forming a single composite negative resistance characteristic for said multistable circuit.

References Cited by the Examiner

Electrical Engineering, pages 270–277, April 1960, "Tunnel Diode Operation and Application," by I. A. Lesk et al.

Hughes Semiconductor Division, May 1960, "Tunnel Diode Applications," by Carl David Todd.

ARTHUR GAUSS, *Primary Examiner.*